(12) United States Patent
Gerbi et al.

(10) Patent No.: US 11,933,184 B2
(45) Date of Patent: Mar. 19, 2024

(54) TURBOMACHINES WITH SAW OR BAW DEVICES, MEASURING ARRANGEMENTS AND INSTALLATION METHODS

(71) Applicant: Nuovo Pignone Tecnologie—S.r.l., Florence (IT)

(72) Inventors: Filippo Gerbi, Florence (IT); Marco Marrazzo, Florence (IT); Lorenzo Miris, Pontassieve (IT)

(73) Assignee: Nuovo Pignone Technologie SRL, Florence (IT)

( * ) Notice: Subject to any disclaimer, the term of this patent is extended or adjusted under 35 U.S.C. 154(b) by 164 days.

(21) Appl. No.: 17/304,275

(22) Filed: Jun. 17, 2021

(65) Prior Publication Data

US 2021/0310369 A1 Oct. 7, 2021

Related U.S. Application Data

(63) Continuation of application No. PCT/EP2019/025469, filed on Dec. 20, 2019.

(30) Foreign Application Priority Data

Dec. 21, 2018 (IT) .......................... 102018000020677

(51) Int. Cl.
*F01D 21/00* (2006.01)
*G01K 11/26* (2006.01)
*H03H 9/00* (2006.01)

(52) U.S. Cl.
CPC .......... *F01D 21/003* (2013.01); *G01K 11/265* (2013.01); *H03H 9/0009* (2013.01);
(Continued)

(58) Field of Classification Search
CPC ... F01D 21/003; G01K 11/265; H03H 9/0009
See application file for complete search history.

(56) References Cited

U.S. PATENT DOCUMENTS 8,797,179 B2 * 8/2014 Subramanian ........... H04Q 9/00
340/870.07
9,194,250 B1 * 11/2015 Tralshawala ............ F01D 11/20
(Continued)

FOREIGN PATENT DOCUMENTS

CN 207583445 U 7/2018

*Primary Examiner* — Long T Tran
(74) *Attorney, Agent, or Firm* — Paul Frank + Collins P.C.

(57) ABSTRACT

An arrangement is disclosed for measuring an environment parameter at a rotor of a rotary machine; according to some embodiments, the parameter to be measured is temperature and the machine to monitor is a turbomachine. The arrangement includes at least: a SAW or BAW device electrically coupled with an antenna, a parameter-sensitive impedance device, and two identical cables electrically coupling the SAW or BAW device respectively with the impedance device and a short-circuit or an open-circuit or a matching impedance device. The SAW or BAW device is located in a first zone of the rotor, while the parameter-sensitive impedance device is located in a second zone of the rotor remote from the first zone of the rotor. An interrogator can obtain environment parameter values by sending RF signals to the SAW or BAW device through the antenna.

15 Claims, 5 Drawing Sheets

(52) U.S. Cl.
CPC ....... *H03H 9/0014* (2013.01); *F05D 2260/80* (2013.01); *F05D 2270/80* (2013.01)

(56) References Cited

U.S. PATENT DOCUMENTS

| | | | |
|---|---|---|---|
| 9,909,443 B2* | 3/2018 | Berkcan | F01D 21/003 |
| 2015/0322813 A1* | 11/2015 | Tralshawala | F01D 11/20 |
| | | | 415/118 |
| 2017/0276020 A1 | 9/2017 | Lee et al. | |

* cited by examiner

TURBOMACHINES WITH SAW OR BAW DEVICES, MEASURING ARRANGEMENTS AND INSTALLATION METHODS

CROSS-REFERENCE TO RELATED APPLICATIONS

This application is the U.S. national stage application filed pursuant to 35 U.S.C. 365(c) and 120 as a continuation of International Patent Application No. PCT/EP2019/025469, filed Dec. 20, 2019, which application claims priority from Italy Patent Application No. 102018000020677 filed Dec. 21, 2018, which applications are incorporated herein by reference in their entireties.

TECHNICAL FIELD

The subject-matter disclosed herein relates to turbomachines with SAW or BAW devices, measuring arrangements and installation methods.

BACKGROUND ART

In turbomachines, for example gas turbine engines, there is the need to monitor one or more environment parameters, for example temperature, especially during their operation.

Monitoring an environment parameter at a rotor of a rotary machine, for example the temperature of a zone of the rotor, is difficult as first the parameter has to be measured and then measured values have to be transferred from the rotor to e.g. an electronic monitoring unit. Therefore, wireless communication techniques have been used in the past.

As known, SAW (=Surface Acoustic Wave) and BAW (=Bulk Acoustic Wave) devices may be used as environment parameter sensors suitable for passive wireless communication; if an interrogator sends an appropriate interrogation RF signal to such a device, the sensor returns a reply RF signal and the difference between the interrogation signal and the reply signal depends on the value of the environment parameter detected by the device (a SAW or BAW device may be designed to detect a specific environment parameter, for example temperature).

Attempts were made in the past to use SAW or BAW devices as passive-communication parameter sensors for monitoring rotors of turbomachines.

However, it is not easy to achieve accurate measurement and reliable communication through a SAW or BAW device in a turbomachine rotating very quickly (for example up to 20,000 rpm) and operating with high vibrations and/or high acceleration forces and/or at high temperature (for example up to 1,000° C.) and/or at high pressure (for example up to 200 atm) and/or with aggressive gases, like a turbomachine used in the field of "Oil & Gas". Furthermore, all or almost all components of such a turbomachine are made of metal and this makes RF communication between interrogator and transponder, i.e., the SAW or BAW device, difficult.

Accordingly, it would be desirable to be able to monitor one or more environment parameters at a rotor of a turbomachine, especially during its operation, accurately and reliably.

SUMMARY

According to one aspect, the subject-matter disclosed herein relates to a turbomachine comprising a rotor and a stator, the rotor having a low-temperature zone and a high-temperature zone being remote from each other; the turbomachine comprises further: a SAW or BAW device electrically coupled with an antenna and located in the low-temperature zone, at least one temperature-sensitive impedance device located in the high-temperature zone, at least one first cable electrically coupling the SAW or BAW device and the at least one temperature-sensitive impedance device, and an interrogator with an antenna located on the stator close to the antenna of the SAW or BAW device at least for a time interval; additionally, the first cable electrically couples the SAW or BAW device and the temperature-sensitive impedance device, the turbomachine comprises further a second cable identical to the first cable, and the second cable is electrically coupled with the SAW device at a first end and short-circuited or open-circuited or coupled with a matching impedance device at a second end.

According to another aspect, the subject-matter disclosed herein relates to an arrangement for measuring an environment parameter at a rotor of a rotary machine, in particular a turbomachine; the arrangement comprises: a SAW or BAW device electrically coupled with an antenna and arranged to be located in a first zone of the rotor, at least one parameter-sensitive impedance device arranged to be located in a second zone of the rotor remote from the first zone of the rotor, and at least one first cable electrically coupling the SAW or BAW device and the at least one parameter-sensitive impedance device; additionally, the first cable electrically couples the SAW or BAW device and the temperature-sensitive impedance device, the arrangement comprises further a second cable identical to the first cable, and the second cable is electrically coupled with the SAW device at a first end and short-circuited or open-circuited or coupled with a matching impedance device at a second end.

According to still another aspect, the subject-matter disclosed herein relates to a method for installing a measuring arrangement at a rotor of a rotary machine, in particular a turbomachine; the method comprises the steps of: A) fixing a SAW or BAW device and an associated antenna in a first zone of the rotor, B) fixing at least one parameter-sensitive impedance device in a second zone of the rotor remote from the first zone of the rotor, C) fixing at least one first cable, in particular a coaxial cable, to the rotor so that it stretches from the first zone to the second zone, D) electrically coupling the SAW or BAW device to a first end of the first cable and the at least one parameter-sensitive impedance device to the second end of the first cable, E) fixing a second cable, in particular a coaxial cable, to the rotor so that it stretches from the first zone to the second zone, and F) electrically coupling the SAW or BAW device to a first end of the second cable and a short-circuit to the second end of the second cable.

BRIEF DESCRIPTION OF THE DRAWINGS

A more complete appreciation of the disclosed embodiments of the invention and many of the attendant advantages thereof will be readily obtained as the same becomes better understood by reference to the following detailed description when considered in connection with the accompanying drawings, wherein.

DETAILED DESCRIPTION OF EMBODIMENTS

In order to monitor one or more environment parameters at a rotor of a turbomachine, a wireless communication technique is necessary.

SAW or BAW devices (especially SAW devices) allow effective communication with a transponder if the distance between the device and the transponder is small (e.g. less than 10 cm) during communication. In a turbomachine, it is possible to place the device at its rotor and the transponder at its stator so that they can communicate well.

Furthermore, there are places at a rotor of a turbomachine where a SAW or BAW device can function well.

However, it is often necessary to measure one or more parameters, for example temperature, at places of a rotor of a turbomachine where communicating and/or functioning of a SAW or BAW device is difficult or even impossible.

Therefore, it was conceived to combine a SAW or BAW device with at least one parameter-sensitive impedance device; the SAW or BAW device is placed where it can communicate and function well while the impedance device is placed where the environment parameter is to be measured; these two places are remote from each other and may be quite far (e.g. 10-100 cm).

Furthermore, the SAW or BAW device and the impedance device are electrically connected through a cable. The cable may be appropriately routed for example so to make installation easy and/or to allow reliable connection. The cable is preferably a coaxial cable so to avoid capturing noise that would reduce measurement accuracy.

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. Reference throughout the specification to "one embodiment" or "an embodiment" or "some embodiments" means that the particular feature, structure or characteristic described in connection with an embodiment is included in at least one embodiment of the subject matter disclosed. Thus, the appearance of the phrase "in one embodiment" or "in an embodiment" or "in some embodiments" in various places throughout the specification is not necessarily referring to the same embodiment(s). Further, the particular features, structures or characteristics may be combined in any suitable manner in one or more embodiments.

When introducing elements of various embodiments the articles "a", "an", "the", and "said" are intended to mean that there are one or more of the elements. The terms "comprising", "including", and "having" are intended to be inclusive and mean that there may be additional elements other than the listed elements.

Figure 1:
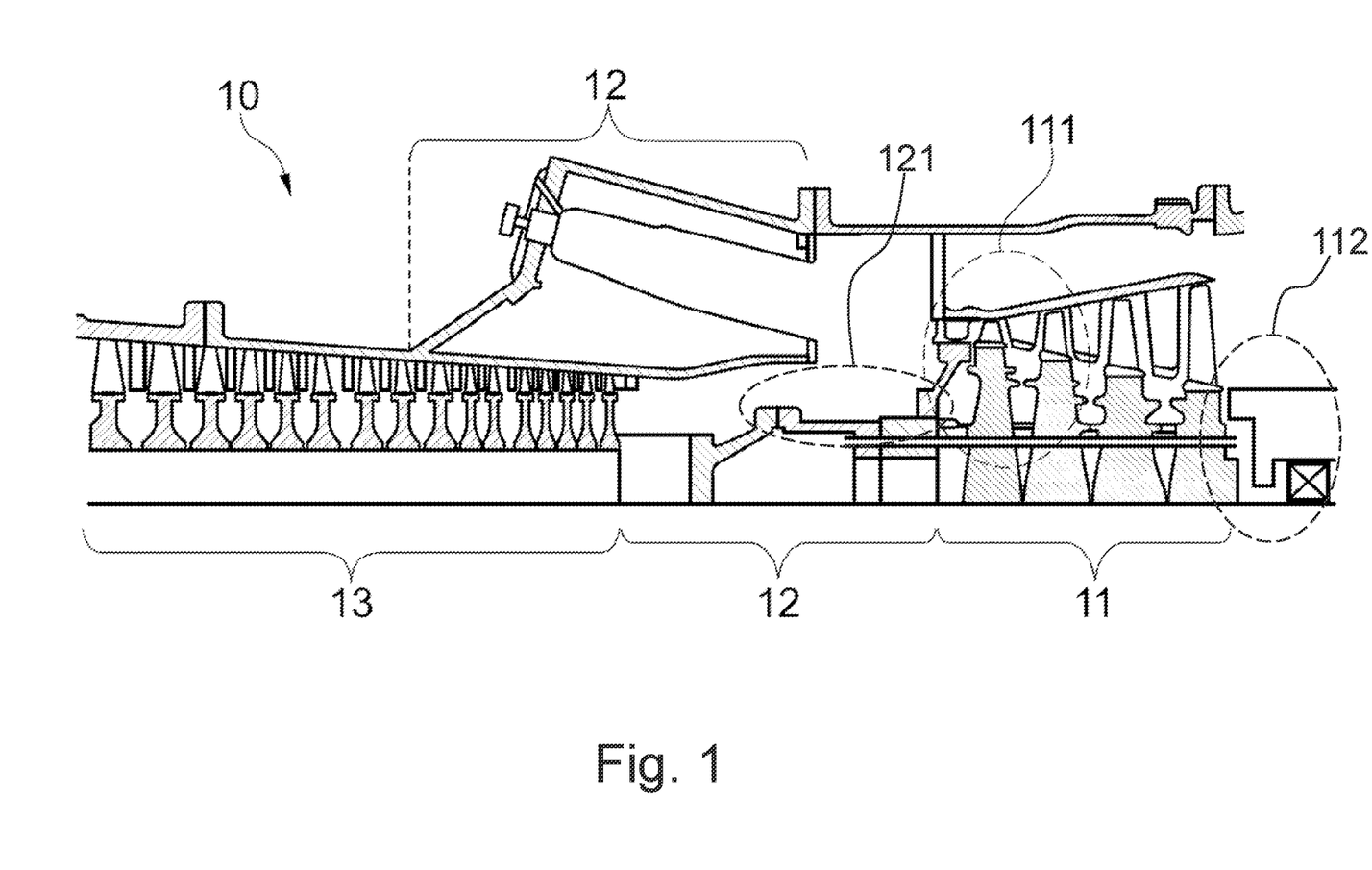
FIG. 1 illustrates a schematic longitudinal-section view of an embodiment of a turbomachine, namely a gas turbine engine.

Referring now to the drawings, FIG. 1 shows schematically a gas turbine engine 10 including a gas turbine 11, a combustor 12 and a compressor 13.

Figure 2:
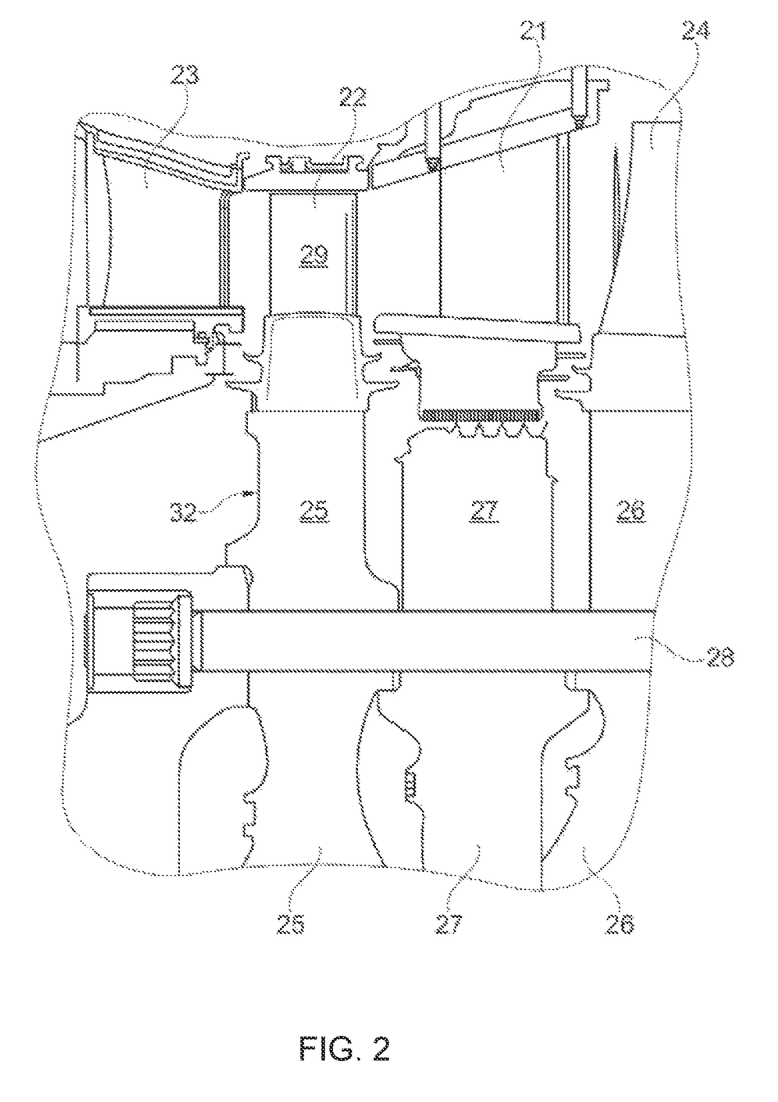
FIG. 2 illustrates a first portion of FIG. 2 in detail.
Figure 3:
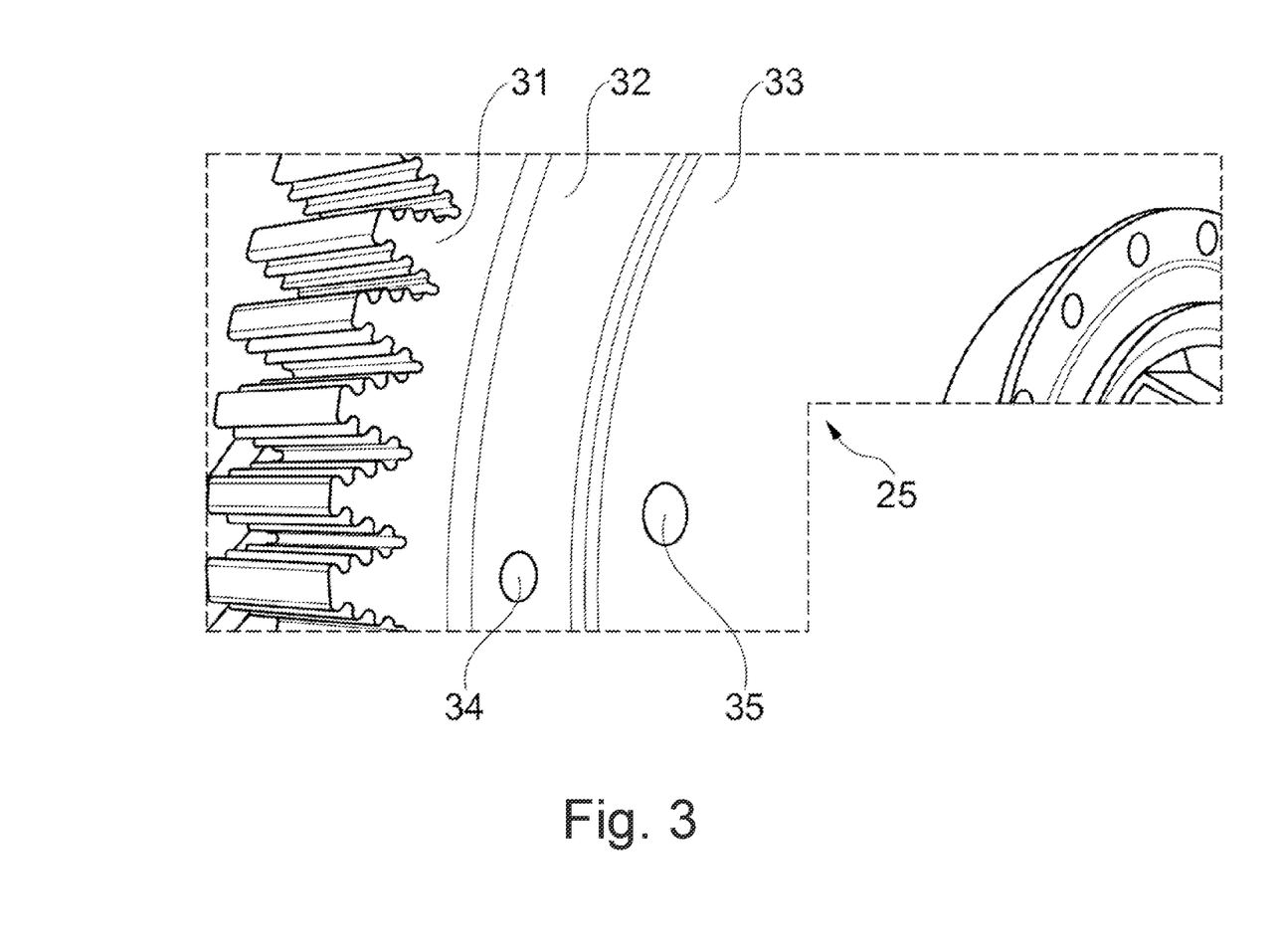
FIG. 3 illustrates a detailed partial perspective view of a rotor wheel included in FIG. 2.

A first portion 111 of gas turbine 11 has been highlighted (see the circle); FIG. 2 shows portion 111 in detail; according to this embodiment, portion 111 is an intermediate portion of gas turbine 11. FIG. 3 is a detailed partial perspective view of a rotor wheel included in FIG. 2.

Figure 4:
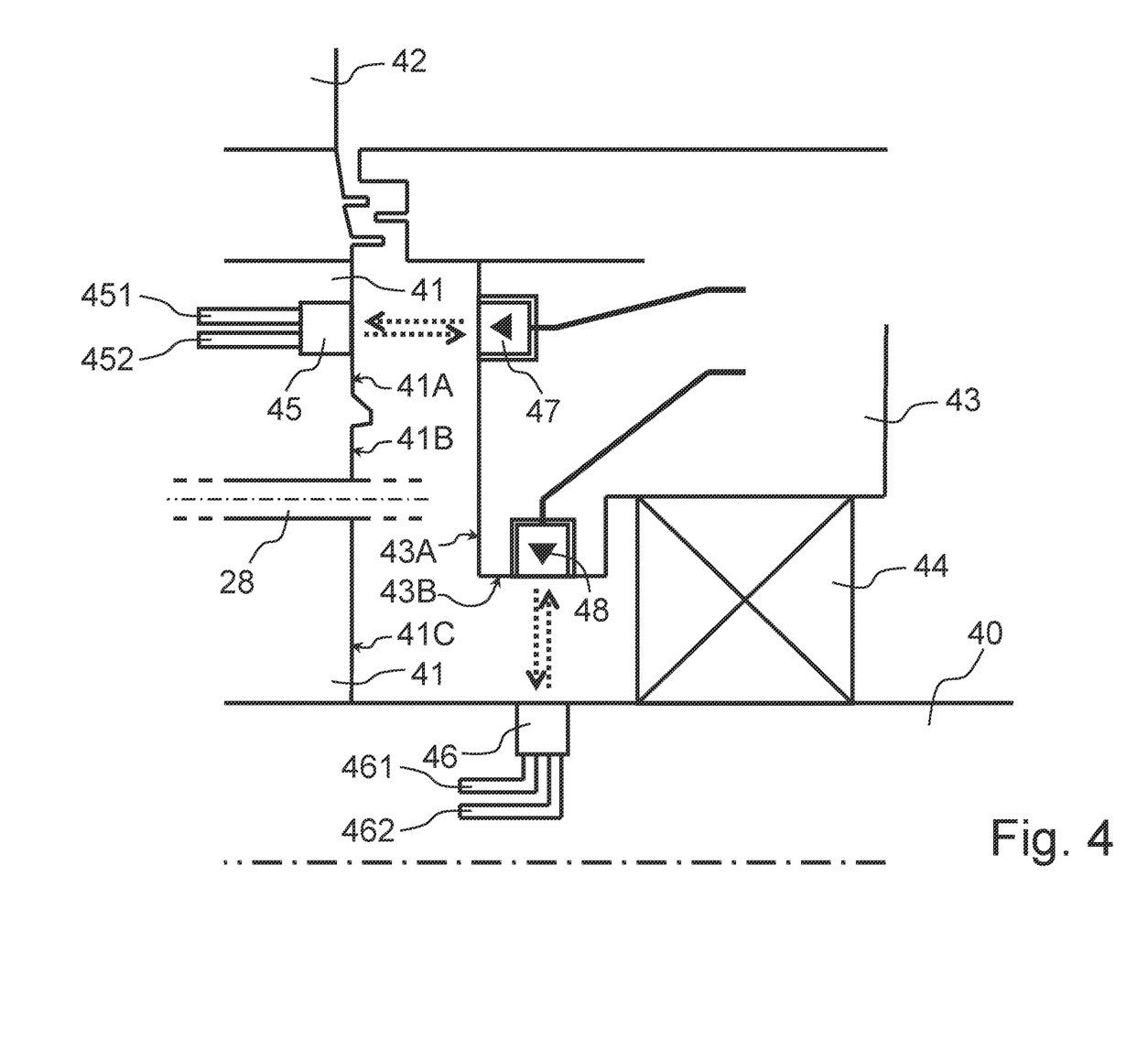
FIG. 4 illustrates a second portion of FIG. 2 in detail.

A second portion 112 of gas turbine 11 has been highlighted (see the circle); FIG. 4 shows portion 112 in detail; according to this embodiment, portion 112 is an end portion of gas turbine 11 where a bearing is located.

A portion 121 of combustor 12 has been highlighted (see the circle); according to this embodiment, portion 121 is an end portion of combustor 12 being at a plenum just upstream of gas turbine 11.

FIG. 2 shows a partial cross-section view of a stationary nozzle assembly 21 and a rotary bucket assembly 22 of a stage of a gas turbine; a further stationary nozzle assembly 23 is partially shown on the left of this stage and a rotary bucket assembly 24 is partially shown on the right of this stage. The rotor is provided with axially spaced rotor wheels (e.g. 25 and 26 in FIGS. 2 and 41 in FIG. 4) and spacers (e.g. 27 in FIG. 2) joined together by e.g. a plurality of circumferentially spaced, axially-extending, bolts (e.g. 28 in FIG. 2 and FIG. 4 is a shank of a bolt). In the illustrated example, each of stationary nozzle assembly 21 and stationary nozzle assembly 23 includes a plurality of circumferentially-spaced, stationary stator blades that surround the rotor. In general in a turbine, between the stationary nozzle assemblies, and rotating with the rotor, there are rotor blades or "buckets" respectively mounted on rotor wheels; in FIG. 2, for example, between stationary nozzle assemblies 21 and 22, there are rotor blades or "buckets" 29 mounted on rotor wheel 25 (see also e.g. FIG. 3).

Each bucket (e.g. 29 of FIGS. 2 and 42 in FIG. 4) includes an airfoil portion supported radially by a shank. A dovetail portion of the bucket (radially extending inwardly to the shank and not shown in detail in FIG. 2 and in FIG. 4) is adapted for connection with generally corresponding dovetail portion (e.g. 31 in FIG. 3) formed in the rotor wheel (see e.g. FIG. 2 and FIG. 4). Bucket is typically integrally cast and at its shank includes axially-projecting inner and outer angel wing seals that cooperate with nozzle seal lands formed on the adjacent nozzle assemblies to limit ingestion of hot combustion gases (flowing through the hot gas path) into wheelspace cavities located radially adjacent to the buckets and the rotor wheel. By alternating the angel wing seals and the nozzle seal lands and by locating them so that tortuous or serpentine radial gaps are established, hot combustion gas ingress into the wheelspace cavities is inhibited. It is to be understood that ingestion of hot combustion gases is also inhibited by cooler purge air flowing through the wheelspace cavities, some of which seeks to exit via the gap.

FIG. 3 highlights for example two lateral surfaces 32 (see also FIG. 2) and 33 of rotor wheel 25; each of these surfaces is annular; surface 32 is an "outer surface"; surface 33 is an "intermediate surface" closer to a shaft of gas turbine 11 than surface 32; there may be for example a third lateral surface, i.e. an "inner surface", closer to a shaft of gas turbine 11 than surface 33 (with reference to the embodiment of FIG. 2 and FIG. 3, the intermediate surface and the inner surface may be divided by e.g. a circumference where axes of bolts 28 are distributed).

FIG. 4 shows a partial cross-section view of a rotary bucket assembly of a last stage of gas turbine 11 including a rotor wheel 41 and an associated rotary bucket 42, rotor wheel 41 is mounted on a shaft 40 of gas turbine 11. A stationary component 43 (i.e. a component of the stator of gas turbine 11) faces rotor wheel 41 and shaft 40. A bearing 44 is located between stationary component 43 and shaft 40.

FIG. 4 highlights for example three lateral surfaces 41A and 41B and 41C of rotor wheel 41; surface 41A is an annular "outer surface" (that may be similar to surface 32 in FIG. 3); surface 41B is an annular "intermediate surface"

closer to shaft 40 than surface 41A (that may be similar to surface 33 in FIG. 3); surface 41C is an circular "inner surface" closer to shaft 40 than surface 41B and with a hole for shaft 40. The outer surface and the intermediate surface may be divided by a rib. The intermediate surface and the inner surface may be divided by a circumference where axes of bolts 28 are distributed.

FIG. 4 highlights for example two surfaces 43A and 43B of component 43; surface 43A faces both surfaces 41A and 41B (and is quite close thereto); surface 43B faces a portion of a lateral surface of shaft 40 (and is quite close thereto). Surfaces 43A and 43B may be considered at a bearing region (of bearing 44), even if surface 43B is closer to bearing 44 than surface 43A. As it will be apparent from the following, several different embodiments are possible; therefore, a surface at a bearing region close to a surface of a rotor wheel (as shown in FIG. 4) is not strictly necessary, even if advantageous, for measuring an environment parameter at a rotor of a rotary machine; therefore also, a surface at a bearing region close to a surface at a bearing region close to a surface of a shaft (as shown in FIG. 4) is not strictly necessary, even if advantageous, for measuring an environment parameter at a rotor of a rotary machine.

It is to be noted that FIG. 4 is quite schematic and the sizes and positions of the shown components do not reflect a real machine; furthermore, for example, details of the bolt are omitted (see dashed lines).

Figure 5:
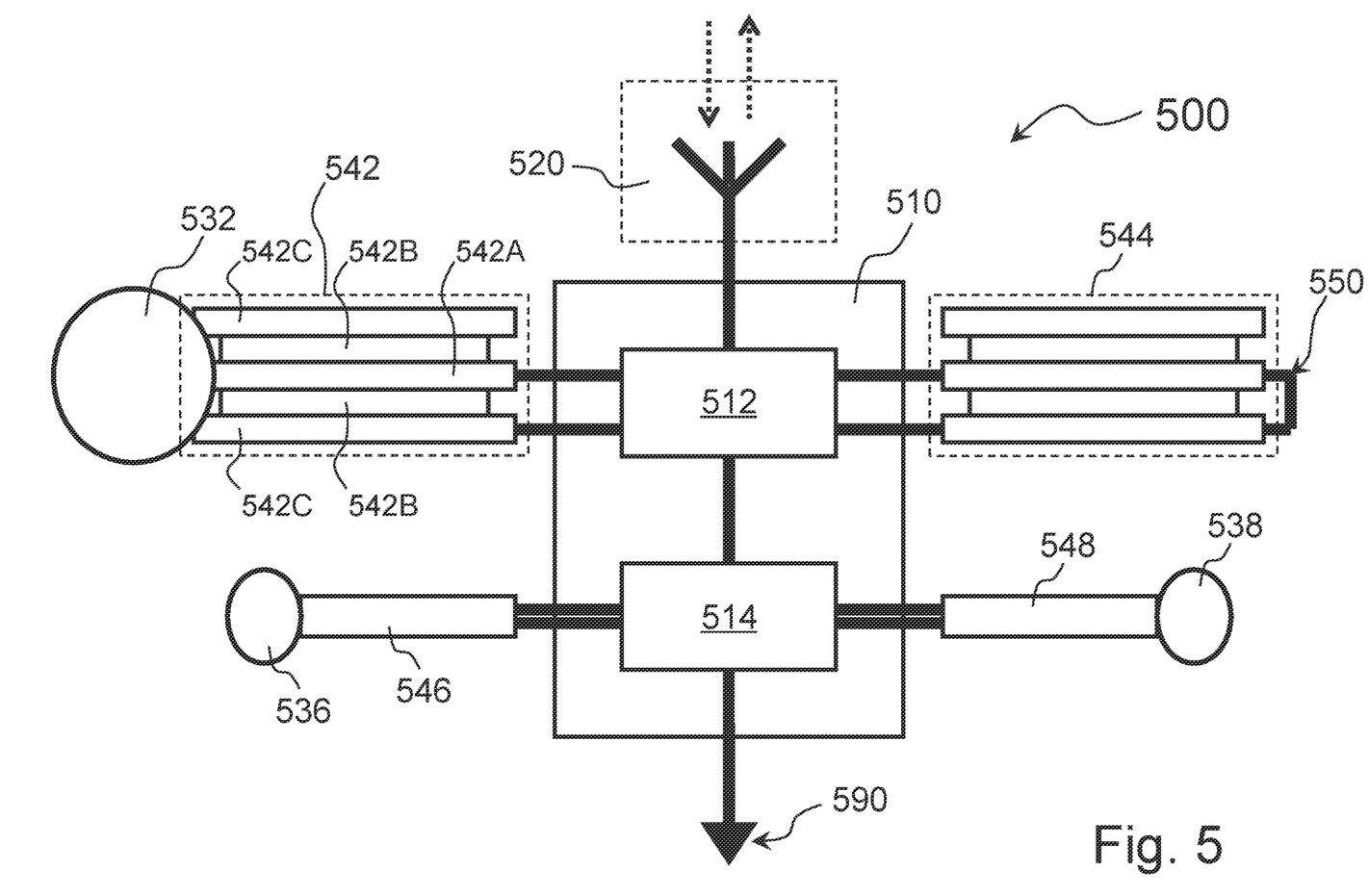
FIG. 5 illustrates a schematic diagram of an embodiment of an arrangement for measuring environment parameters.

FIG. 5 shows an exemplary embodiment of an arrangement 500 for measuring environment parameters. There is an electric device 510 incorporating a first SAW (or alternatively BAW) device 512 and a second SAW (or alternatively BAW) device 514 electrically connected together through a wire; first SAW device 512 is electrically connected to an antenna 520 through a wire for communicating with transponders; second SAW device 514 is electrically connected to ground 590 through a wire. Each of the first and second SAW devices 512 and 514 has a first port and a second port for connection to a parameter-sensitive impedance device, for example a temperature-sensitive resistor. The first port of first SAW device 512 is electrically connected to an impedance device 532. The second port of first SAW device 512 is electrically connected to a short-circuit 550; alternatively, it may be connected to an open-circuit or a matching impedance device, i.e. a fixed impedance device. The first port of second SAW device 514 is electrically connected to an impedance device 536. The second port of second SAW device 514 is electrically connected to an impedance device 538.

It is to be noted that, in the present description, the terms "connection", "connect(s)" and "connecting/ed" do not mean "direct electrical connection", "directly electrically connect(s)" and "directly electrically connecting/ed"; in other words, for example, if component A is connected to component B, one or more or none other electrical components may be placed between components A and B; however, in the claims, the more general terms "couple(s)" and "coupling/ed" are used.

According to alternative embodiments, the measuring arrangement may include only one SAW or BAW device or three or more SAW or BAW devices.

According to alternative embodiments, one of the ports of the SAW or BAW device may be left unused, in particular unconnected.

In the embodiment of FIG. 5, connection between a SAW device and a parameter-sensitive impedance device is made through a cable, in particular a two-wire electrical cable. FIG. 5 shows cables 542, 546 and 548; cable 544 that is identical or similar to cables 542, 546 and 548 is not used for connection to a parameter-sensitive impedance device. Preferably, these cables are coaxial cables (see in particular cables 542 and 544).

The arrangement of FIG. 5 is designed to measure environment parameters, in particular three parameters, at a rotor of a turbomachine 10. Electric device 510 is arranged to be located in a first zone of the rotor; by locating device 510 in a certain place, both first and second SAW devices 512 and 514 are located approximately in the same place as the sizes of device 510 is typically of 5-20 mm. Parameter-sensitive impedance devices 532, 536 and 538 are arranged to be located in other zones of the rotor remote from the first zone; although cables 542, 546 and 548 are shown as very short in FIG. 5 they are typically quite long, for example from 10 cm to 100 cm, and they have typically a different length.

According to the embodiment of FIG. 5, coaxial cable 542 comprises an electrically conducting core 542A made of metal, surrounded by a tubular electrically insulating layer 542B made of a ceramic material, surrounded by a tubular electrically conducting shield 542C being preferably also a sheath of the cable made of metal. The metal of core 542A is in particular copper or nickel. The ceramic material of layer 542B is in particular a ceramic oxide like e.g. aluminum oxide or magnesium oxide. The metal of shield/sheath 542C is in particular steel, and more in particular stainless steel. At a first end cable 542 is electrically connected (e.g. through two wires) to a port of first SAW device 512, while at a second end cable 542 is electrically connected (appropriately) to device 532. Similar considerations may apply to cables 544, 546 and 548 keeping in mind that device 550 is not a parameter-sensitive impedance device.

First and second SAW devices 512 and 514 may be (appropriately) interrogated by a single interrogator that, in this way, through a single interrogation it can obtain three parameter values, for example three temperature values at three distinct and remote places of a rotor of the turbomachine 10 of FIG. 1. These three places are the places where devices 532, 536 and 538 are located.

It is to be noted that when an interrogation signal is received by e.g. SAW device 512, it is "forwarded" to all its output ports, i.e. two ports according to the embodiment of FIG. 5 (one on the right and one on the left). Such device may advantageously be designed so that the signal output from a second port is delayed with respect to the signal output from a first port; in this case, there will be a first reply to the interrogation due to the cable and impedance connected to the first port and later a second reply to the same interrogation due to the cable and impedance connected to the second port; the delay between two consecutive replies to the same interrogation may be for example in the range of 1-100 μs (microseconds).

In general, there is a need of monitoring several environment parameters at one or more rotors of a turbomachine; in these case, more than one measuring arrangement may be used. When using a plurality of SAW and/or BAW devices, in particular electric devices integrating a set of SAW and/or BAW devices associated to an antenna, it is preferred to locate them in or on a rotor of the turbomachine so to balance their masses in order to avoid or reduce vibrations due to the measuring arrangement.

The embodiment of FIG. 5 includes a particularly advantageous solution: a first cable 542 connects a first port of device 512 to a parameter-sensitive impedance device 532, a second cable 544 connects a second port of device 512 to a short-circuit 550; second cable 544 is preferably identical to first cable 542; first cable 542 and/or second cable 544 are preferably of coaxial type, and more preferably of a same coaxial type. If device 532 and short-circuit 550 are located at the same place of the rotor, negative effects of their electrical connection may be compensated, in particular negative effects due to temperature variation along the cables. This result is achieved even better if cable 542 and cable 544 run in parallel along the rotor.

A further improvement to the embodiment of FIG. 5 may consist in using a third cable preferably identical to first cable 542 and preferably of coaxial type, and in connecting it to a third port of device 512 from one side and to an open-circuit on another side. If device 532, short-circuit 550 and the open-circuit are located at the same place of the rotor, any negative effects of their electrical connection may be compensated, in particular any negative effects due to temperature variation along the cables including variations of the impedance and propagation constant due to temperature variation.

The above-mentioned compensation based on two identical (or similar) cables and the above-mentioned compensation based on three identical (or similar) cables may advantageously be carried out by comparing distinct and delayed replies from the same SAW and/or BAW device to the same interrogation with (basically) the same temperature conditions of the rotor. For example, in the case of FIG. 5, a first reply may be due to device 532 and a second reply may be due to short-circuit 550. For example, in the case of three identical (or similar) cables, a first reply may be due to an impedance device, a second reply may be due to a short-circuit, and a third reply may be due to an open-circuit.

A specific embodiment will now be described with reference to figures FIG. 1, FIG. 2, FIG. 3 and FIG. 4.

Turbomachine 10, specifically a gas turbine engine, includes at least one rotor and at least one stator and may be divided into a gas turbine 11, a combustor 12 and a compressor 13. During operation of turbomachine 10, temperature is not distributed uniformly. Even referring for example to turbine 11, temperature varies from place to place; we can assume that there are at least one low-temperature zone, for example wherein the temperature is 50-150° C. or even lower (e.g. 0-50° C.) and at least one high-temperature zone, for example wherein the is 250-400° C. or even higher (e.g. 400-800° C.) remote from each other. Similar considerations apply to combustor 12 and compressor 13. In this case, an environmental parameter that might be interested to be monitored is temperature, in particular temperature at various places of a rotor of the turbomachine, in particular a rotor of the turbine.

In order to monitor temperature, turbomachine 10 may comprise at least one arrangement identical or similar to arrangement 500 of FIG. 5. In particular, the turbomachine may comprise:
- at least one SAW or BAW device (see for example device 45 or 46 in FIG. 4 or device 512 or 514 in FIG. 5) electrically connected to an antenna and located in the low-temperature zone,
- at least one temperature-sensitive impedance device (see for example device 34 or 36 in FIG. 3 or device 532 or 536 or 538 in FIG. 5), in particular a temperature-sensitive resistor, located in the high-temperature zone,
- at least one first cable (see for example cable 451 or 452 or 461 or 462 in FIG. 4 or cable 542 or 546 or 548 in FIG. 5) electrically connecting the at least one SAW or BAW device and the at least one temperature-sensitive impedance device, and
- an interrogator (see for example 47 and 48 in FIG. 4) with an antenna located on the stator close to the antenna (520) of the SAW or BAW device (45, 46, 512, 514) at least for a time interval.

As can been seen in FIG. 4, interrogator 47 is close to SAW device 45 and interrogator 48 is close to SAW device 46; such distances may be for example 1-100 mm, preferably 2-20 mm. It should be taken into consideration that interrogators are steady, being fixed to a stator, and SAW or BAW devices are moving, being fixed to a rotor; therefore, FIG. 4 corresponds to a situation when interrogators and transponders are at minimum distance. If the rotation speed of the rotor is e.g. 12,000 rpm, the time interval that may be considered as "minimum distance" may be for example about 1 ms (during this time, an interrogator signal is transmitted by the interrogator to the transponder and a reply signal from the transponder is received by the interrogator); if the rotation speed of the rotor is e.g. 1,200 rpm, the time interval that may be considered as "minimum distance" may be for example about 10 ms (during this time, an interrogator signal is transmitted by the interrogator to the transponder and a reply signal from the transponder is received by the interrogator); if the turbomachine is designed to rotate at different speeds, the highest rotation speed has to be primarily taken into account.

The interrogator is arranged to interrogate the SAW or BAW device by transmitting RF signals at frequencies in the range from 300 KHz to 3 GHz, preferably in the range from 300 MHz to 3 GHz, even more preferably in the range from 1 GHz to 3 GHz.

As shown in FIG. 5 with reference to device 512 and device 532, device 45 and/or device 46 may use the two ports for measuring temperature at a single place even if electrically connected to two cables, in particular coaxial cables.

As shown in FIG. 5 with reference to device 514 and devices 536 and 538, device 45 and/or device 46 may use the two ports for measuring temperature at two places e.g. the places of devices 34 and 35 in FIG. 3.

In FIG. 4, SAW (or BAW) device 45 (acting as a transponder), as well as its antenna, is fixed to wheel 41 of a rotor preferably by welding, and SAW (or BAW) device 46 (acting as a transponder), as well as its antenna, is fixed to shaft 40 of a rotor preferably by welding; a third possibility, not shown in the figures, is to fix a SAW or BAW device to a spacer (see e.g. spacer 27 in FIG. 2) of the rotor preferably by welding. Devices 45 and 46 may be located inside recessed seats, while their antenna is preferably at an outer region of such seats.

In FIG. 4, interrogators 47 and 48, as well as its antenna, are located at a region of a bearing 44; another possibility, not shown in the figures, is to locate one or more interrogators at a nozzle assembly (see, e.g., nozzle 21 and nozzle 23 in FIG. 2).

As already said, the turbomachine may include several temperature-sensitive impedance devices electrically connected to SAW or BAW devices and located at different places of one or more high-temperature zones of the turbomachine. For example with reference to FIG. 1, there may be some impedance devices at the rotor turbine 11 and/or at the rotor of combustor 12 and/or of at the rotor of compressor 13.

FIG. 4 shows two SAW (or BAW) devices (acting as transponders) located on the same rotor in an asymmetric way and at different parts of the rotor. However, when several impedance devices are necessary, it is advantageous to place a set, e.g. two or three or four or five, SAW or BAW devices, in or on the rotor so to balance their masses. For example, a turbomachine may include three or four devices like device 45 on the same circumference of a wheel offset by 120° or 90° and/or two or three devices like device 46 on the same circumference of a shaft offset by 180° or 120°.

A method for installing a measuring arrangement identical or similar to arrangement 500 in FIG. 4 at a rotor of a rotary machine, in particular turbomachine 10 in FIG. 1, comprises in general the steps of:

A) fixing a (more in general, at least one) SAW or BAW device and an associated antenna in a first zone of the rotor, B) fixing at least one parameter-sensitive impedance device in a second zone of the rotor remote from the first zone of the rotor, C) fixing at least one first cable, in particular a coaxial cable, to the rotor so that it stretches from the first zone to the second zone, and D) electrically connecting the SAW or BAW device to a first end of the first cable and the at least one parameter-sensitive impedance device to the second end of the first cable;

this applies for example to each of devices 512 and 514 of arrangement 500.

According to some embodiments of the measuring arrangement (this applies for example to arrangement 500 as far as device 512 is concerned), also the following steps may be provided:

E) fixing a second cable, in particular a coaxial cable, to the rotor so that it stretches from the first zone to the second zone, and F) electrically connecting the SAW or BAW device to a first end of the second cable and a short-circuit to the second end of the second cable; in this case, the first cable and the second cable run preferably in parallel.

According to some embodiments of the measuring arrangement, also the following steps may be provided:

fixing a third cable, in particular a coaxial cable, to the rotor so that it stretches from the first zone to the second zone, and electrically connecting the SAW or BAW device to a first end of the third cable and an open-circuit to the second end of the third cable; in this case, the first cable and the second cable and the third cable run preferably in parallel.

According to some embodiments of the measuring arrangement (this applies for example to arrangement 500 as far as device 514 is concerned), also the following steps may be provided.

G) fixing an other parameter-sensitive impedance device in a third zone of the rotor remote from the first zone of the rotor, H) fixing an other cable, in particular a coaxial cable, to the rotor so that it stretches from the first zone to the third zone, and L) electrically connecting the SAW or BAW device to a first end of the other cable and the other parameter-sensitive impedance device to the second end of the other cable.

When several SAW or BAW devices are used, it is advantageous to fixed them (possibly together with their antennas) in or on the rotor so to balance their masses.

The invention claimed is:

1. A turbomachine, comprising:
a rotor and a stator, the rotor having temperature zones, including a low-temperature zone and a high-temperature zone, that are remote from each other;
a SAW device with a first antenna and located in the low-temperature zone,
a temperature-sensitive impedance device located in the high-temperature zone,
a first cable electrically coupling the SAW device and the temperature-sensitive impedance device, and
an interrogator with a second antenna located on the stator close to the first antenna of the SAW device at least for a time interval, and
a second cable, identical to the first cable,
electrically coupling the SAW device at a first end and short-circuited at a second end.

2. The turbomachine of claim 1, wherein the interrogator is arranged to interrogate the SAW device by transmitting RF signals at frequencies in the range from 300 KHz to 3 GHz.

3. The turbomachine of claim 1, further comprising:
a third cable, identical to the first cable, electrically coupling the SAW device at a first end and open-circuited at a second end.

4. The turbomachine of claim 1, wherein the SAW device is fixed to a shaft of the rotor.

5. The turbomachine of claim 1, wherein the SAW device is located inside a recessed seat of a shaft of the rotor.

6. The turbomachine of claim 1, wherein the antenna of the interrogator is located at a bearing region.

7. The turbomachine of claim 1, further comprising:
a plurality of temperature-sensitive impedance devices electrically coupled with the SAW and located at different places of the high-temperature zone.

8. The turbomachine of claim 1, further comprising:
a plurality of SAW devices located on the rotor so as to balance their masses.

9. An arrangement for measuring an environment parameter at a rotor of a rotary machine, in particular a turbomachine, comprising:
a SAW device electrically coupled with an antenna and arranged to be located in a first zone of the rotor,
a parameter-sensitive impedance device arranged to be located in a second zone of the rotor remote from the first zone of the rotor,
a first cable electrically coupling the SAW device and the temperature-sensitive impedance device; and
a second cable, identical to the first cable, electrically coupling the SAW device at a first end and short-circuited with a matching impedance device at a second end.

10. The arrangement of claim 9, further comprising:
a third cable, identical to the first cable, electrically coupling the SAW device at a first end and open-circuited at a second end.

11. The arrangement of claim 9, further comprising:
a plurality of parameter-sensitive impedance devices electrically coupled with the SAW device and arranged to be located at different places of the rotor remote from the first zone of the rotor.

12. The arrangement of claim 9, further comprising:
a plurality of SAW devices arranged to be located on the rotor so as to balance their masses.

13. A method for installing a measuring arrangement at a rotor of a rotary machine, in particular a turbomachine, comprising steps of:

A) fixing a SAW device and an associated antenna in a first zone of the rotor,

B) fixing a first parameter-sensitive impedance device in a second zone of the rotor remote from the first zone of the rotor, C) fixing a first cable to the rotor so that it stretches from the first zone to the second zone,
D) electrically coupling the SAW device to a first end of the first cable and the first parameter-sensitive impedance device to the second end of the first cable,
E) fixing a second cable to the rotor so that it stretches from the first zone to the second zone, and
F) electrically coupling the SAW device to a first end of the second cable and a short-circuit to the second end of the second cable.

14. The method of claim 13, further comprising steps of:
fixing a third cable to the rotor so that it stretches from the first zone to the second zone, and
electrically coupling the SAW device to a first end of the third cable and an open-circuit to the second end of the third cable.

15. The method of claim 13, further comprising steps of:
G) fixing a second parameter-sensitive impedance device in a third zone of the rotor remote from the first zone of the rotor,
H) fixing a fourth cable to the rotor so that it stretches from the first zone to the third zone, and
L) electrically coupling the SAW device to a first end of the fourth cable and the second parameter-sensitive impedance device to the second end of the fourth cable.

* * * * *